United States Patent [19]

Deroux-Dauphin et al.

[11] Patent Number: 5,751,736
[45] Date of Patent: May 12, 1998

[54] TESTABLE ELECTRONIC SYSTEM

[75] Inventors: Patrice Deroux-Dauphin, Saint Egreve; Christian Francois, Civrieux, both of France

[73] Assignee: Temento Systems

[21] Appl. No.: 694,595

[22] Filed: Aug. 9, 1996

[30] Foreign Application Priority Data

Aug. 11, 1995 [FR] France ................. 95 09894

[51] Int. Cl.$^6$ ............................. G06F 11/00
[52] U.S. Cl. ............................. 371/22.31
[58] Field of Search ............... 371/22.31, 22.32, 371/22.33, 22.34; 395/183.06

[56] References Cited

U.S. PATENT DOCUMENTS 5,651,110  7/1997  Powers et al. ............. 395/183.06

Primary Examiner—Vincent P. Canney
Attorney, Agent, or Firm—Plevy & Associates

[57] ABSTRACT

A testable electronic system includes testable elements having standardized test interfaces for organizing the elements in chains which behave like shift registers to ensure the exchange of test information. Each element are either a component including an identifier characterizing the behavior of the test of the component and accessible by the test interface of the component, or a switch for organizing a chain in sub-chains which can be individually selected through channels of the switch. The system includes master switches which define respective sub-sets of elements, a specific channel of each master switch being reserved to access an identifier characterizing the test organization of the associated sub-set.

8 Claims, 2 Drawing Sheets

5,751,736

1

TESTABLE ELECTRONIC SYSTEM

BACKGROUND OF THE INVENTION

1. Field of the Invention

The present invention relates to an electronic system including testable components.

2. Description of the State of the Art

IEEE standard 1149.1-1990, entitled <<IEEE Standard Test Access Port and Boundary-Scan Architecture>>, defines a test interface, called Test Access Port (TAP), which components must have to be testable according to the standard. The interface includes five signals, namely a Test Data Input signal TDI, a Test Data Output signal TDO, a Test Mode Select signal TMS, a Test Clock signal TCK and a test reset signal TRST. A component with a TAP interface also has a finite state machine whose behavior is determined by the standard, especially for responding to standardized instructions permitting to manage the tests.

The IEEE standard also defines a boundary test architecture to be used in association with TAP interfaces.

FIG. 1 illustrates one application of the boundary test architecture to components 10, generally logic circuits. Each pin 13 of components 10 is connected to the internal logic of the components by a test cell 15. Outside the test phases, cells 15 are transparent, i.e., they have no influence on signals passing between pins 13 and the internal logic. During a boundary test phase, all the cells 15 of each component are connected together in a chain which behaves like a shift register, each cell 15 forming a latch of the shift register. Signal TDI corresponds to the input of the shift register and signal TDO corresponds to the output of the shift register. Thus, each standardized component includes two pins assigned to signals TDI and TDO, and further includes three additional pins assigned to three other signals TMS, TCK and TRST.

As represented in FIG. 1, the cells 15 of a plurality of components can be inserted into a long chain by connecting pin TDO of a first component to pin TDI of the next component. Pin TDI of the first component and pin TDO of the last component allow respectively to serially introduce data into cells 15 and to serially read the data stored in cells 15, these operations being clocked by the test clock TCK which is provided to all the components at the same time.

With such an architecture, it is thus possible to present data, or test vectors, to the circuit's inputs and to retrieve the corresponding results at the circuit's outputs. In a sequential logic circuit, clock signal TCK allows to step through several states before the results are read again.

The boundary test architecture further allows to test the connections between the integrated circuit components.

To avoid the formation of particularly long chains of components in a complex system, which would render the tests very long, the components are partitioned into sub-chains which are selected by standardized switches.

FIG. 2 illustrates the use of such a switch 17. Like the other standardized components, switch 17 also has a TAP interface, through which it receives a channel selection instruction. The switch 17 represented in FIG. 2 has four channels 0, 1, 2 and 3. Such a 4-channel switch is a component available on the market, e.g. the circuit referenced TTACT8997 manufactured by Texas Instruments. Such switches can be cascaded to increase the number of channels.

Switch 17 connects the five signals of the TAP interface to the selected channel 0 to 3. In practice, the reset signal TRST is provided at the same time to each component, and switch 17 switches only the four remaining signals.

Thus, sub-chains of components 10 respectively connected to the channels of a switch 17 can be independently tested, which decreases the volume of test vectors to be provided and the results to be retrieved in the common case where an electronic system is only partially tested.

As represented by reference ID in components 10 of FIG. 2, according to the IEEE standard, the components are provided with an identifier including, for example, the type of component and its version. Each identifier in fact characterizes the test behavior of the component, i.e., the test results to be obtained in response to test vectors that may be provided to the component. Thus, an operator can initially read the identifiers of the components of a sub-chain and set up, with these identifiers, a suitable test sequence.

The boundary test of a component is insufficient to detect all the defects of a component. Indeed, a component may include a plurality of logic levels which, through successive errors, invert a data an even number of times. Hence, although the result corresponds to the expected result, the component is defect. Thus, as an extension of the boundary test, the flip-flops of a component are conventionally realized so that they can be chained during a test phase, like the cells 15, to introduce test vectors and to read results.

However, for complex components, the number of test vectors and of corresponding results are so important that such tests are achieved only for single components or, at most, for a small number of components. If it is desired to test an electronic system including a large number of complex components, it is necessary to create a data base which stores not only the test vectors and the corresponding results for each component, but also all the test connections between the components, i.e., the component chains and sub-chains defined by the switches. The management of such a data base is particularly complex, since electronic systems are generally formed by boards that can be placed in an arbitrary connector of a backplane (which of course requires to modify the organization of the chains and sub-chains), and since each board can generally be replaced with an identical board including components of a different version, having the same functions as the components of the preceding board, but having different test behaviors (which modifies the test vectors and the corresponding results). Since the exchanging of boards in electronic systems is common, such a test system cannot be devised, because, each time a board is exchanged, a heavy updating operation of the data base is required.

SUMMARY OF THE INVENTION

An object of the present invention is to provide a testable electronic system complying with the above mentioned IEEE standard, which can have a complex and evolutive test structure while simplifying, or even eliminating, the up-dating operations of a data base in case of evolution.

To achieve this object, the present invention provides a structure of the system's elements which allows a test software to automatically scan the system so as to "learn" the organization of its chains and sub-chains of components until the system finds a path to an element that is to be tested. Then, this path only is selected and the system uses the test vectors and the corresponding results which are found in a data base with the help of identifiers found on the path.

For this purpose, the testable electronic system includes testable elements having standardized test interfaces for organizing the elements in chains which operate as shift registers to ensure the exchange of test information, each element being either a component including an identifier characterizing the behavior of the test of the component accessible by the test interface of the component, or a switch for organizing a chain in sub-chains which can be individually selected through channels of the switch. Master switches define respective sub-sets of elements, a specific channel of each master switch being reserved to access a specific identifier of the test organization of the associated sub-set.

According to an embodiment of the invention, the channels of each master switch, other than the reserved one, are connected to sub-chains that can include, in an arbitrary organization, one or more elements or master switches.

According to an embodiment of the invention, each sub-set corresponds to a printed circuit board including a connector connecting its master switch to a channel of a master switch of another board, all the boards being connected, through interposed master switches, to a channel of a master switch of a single interface board through which the system is tested.

According to an embodiment of the present invention, the system includes a data base associating:

with each distinct component identifier, a set of test vectors and of corresponding expected results; and with each distinct sub-set or board, information indicating the organization of the board's sub-chains, an assembly of test vectors associated with each sub-chain of the board, and the corresponding expected results.

The invention also relates to a method of use of the above system including, to test a predetermined board, the step of scanning the graph formed by the connections between boards until a path to the predetermined board is found, the graph being scanned by scanning each board that is found connected to a preceding board by using the information associated, in the data base, with the identifier of the preceding board.

According to an embodiment of the present invention, the graph is scanned along an Euler path for linking all the boards together, the algorithm for establishing the Euler path being modified so that the Euler path can pass more than once through a same channel.

According to an embodiment of the present invention, the method includes the step of testing the predetermined board by using vectors associated, in the data base, with the identifier of the predetermined board, the vectors being provided, and the corresponding results retrieved, through the path that was found.

According to an embodiment of the present invention, the method includes the following steps:

searching for a predetermined component by reading the identifiers of the components in the sub-chains of the pre-determined board; and testing the predetermined component by using test vectors associated, in the data base, with the component identifier.

The foregoing and other objects, features, aspects and advantages of the invention will become apparent from the following detailed description of the present invention when taken in conjunction with the accompanying drawings.

DETAILED DESCRIPTION OF THE DRAWINGS

Figure 1:
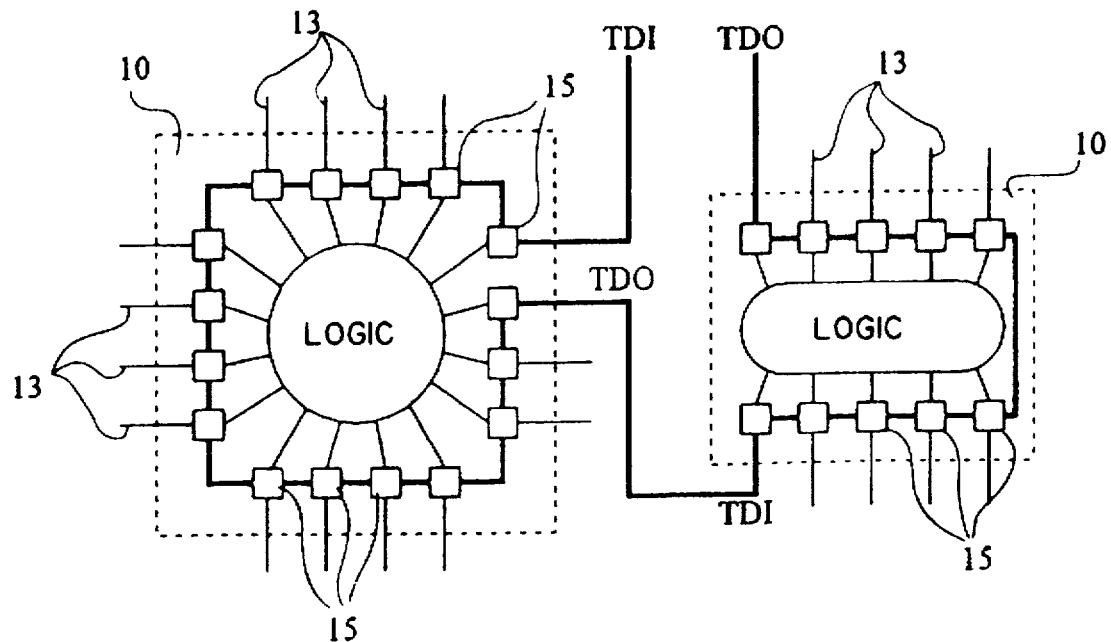
FIG. 1, above described, schematically represents a boundary test organization according to IEEE standard 1149.1-1990.
Figure 2:
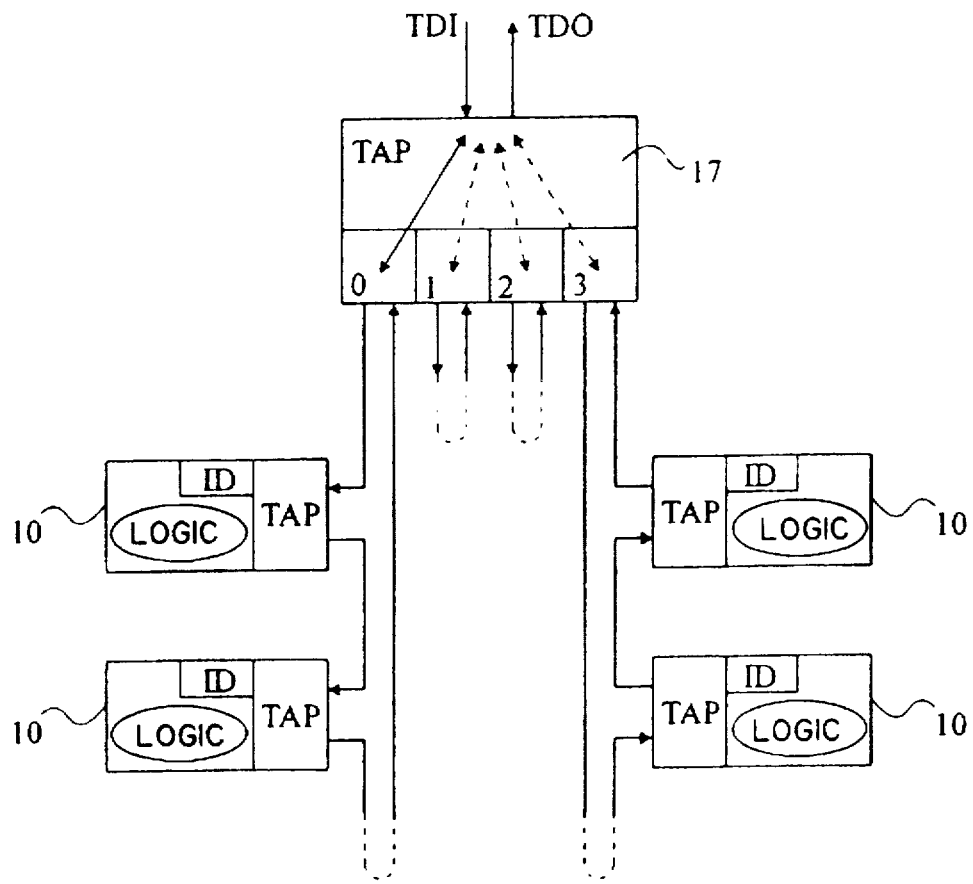
FIG. 2, above described, represents a subdivision of components to be tested in a plurality of sub-chains accessible by a conventional switch.
Figure 3:
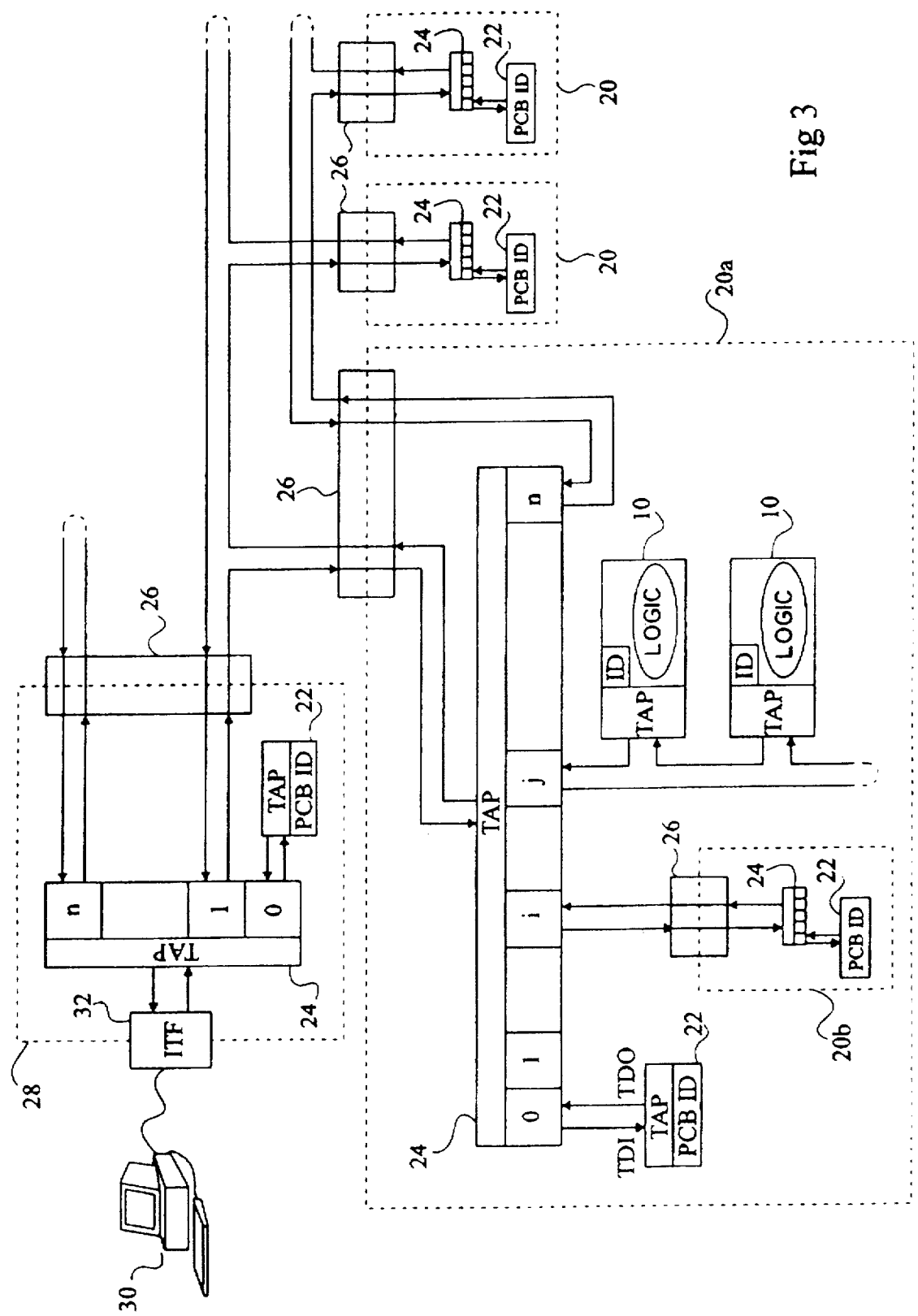
FIG. 3 schematically and partially represents an electronic testable system according to the invention.

In FIG. 3, according to the invention, the testable components 10 are partitioned into sub-sets 20, preferably printed circuit boards. One of the boards, designated 20a, is represented in more detail. According to an essential feature of the invention, each board includes a board identifier 22 which is accessible through a specific channel, always the same for a predetermined system, for example 0, of a master switch 24. Preferably, the master switch is the only test access to the board.

Each master switch 24 includes an arbitrary number of channels that are all assigned, except for channel 0, to any desired elements which may be component sub-chains (which is represented by channel j), other switches, and eventually, as represented by channels i and n, master switches 24 of other boards, such as a daughter-board for channel i, or a chain of boards connected to a same backplane for channel n. Boards are conventionally interconnected or connected to the backplane by connectors 26 which thus transmit the five test signals.

Thus, an arbitrary hierarchical test organization is achieved where a board is connected in a chain of boards of same hierarchical level, the chain being serviced by one channel of the master switch of a board of higher hierarchical level (of course, a sub-chain may only include a single board, as is the case for channel i in board 20a). All the chains and sub-chains of the system converge, by means of master switches, to the channels of a master switch 24 of a single interface board 28. Like boards 20, the interface board 28 is provided with a board identifier 22, accessible through the specific channel 0 of its master switch 24. Thus, a data processing system 30, connected to the master switch of board 28 through a suitable interface circuit 32, can access the whole system to be tested.

Each board identifier 22 characterizes the organization of the sub-chains of the board, so that it is possible to reconstruct this organization with reference to a data base. For example, for board 20a, identifier 22 allows to retrieve information in the data base indicating that channel i of the master switch is connected to another board 20b, that channel j is connected to a sub-chain of components and the number of components of the sub-chain, and that channel n is connected to a sub-chain of boards. Thus, the data base includes a set of "pieces" of architecture corresponding to the organizations of the boards, which are temporarily assembled, as described hereinafter, to form a path to a board to be tested.

For a board identifier 22 to be accessible through the associated master switch, the identifier should behave like a component which is testable through a standardized TAP interface. Each identifier 22 is included, for example, in a ROM or EPROM memory whose bits are made serially accessible through signals TDI and TDO by a control circuit which controls the memory and behaves like the state machine defined by the IEEE standard.

To access a specific board of the system of FIG. 3, the data processing system 30 operates as follows. The system first reads the identifier 22 of the interface board 28 and, referring to the data base, acquires the organization of the channels of the master switch 24, i.e., in the particular case of interface board 28, the system acquires the number of boards that are connected to each of channels 1 to n. Then, the system successively scans the channels of the master switch of the board (except for channel 0). The system stores for each channel the presence of a sub-chain of boards. If a channel has not been scanned yet, the only information the system has on the associated boards is the number of boards and that their identifiers 22 are accessible through the specific channel 0. Then, the system goes down one hierarchical level by selecting one of the unknown boards, for example 20a, by reading its identifier 22. By referring to the data base, the system acquires the organization of board 20a, and especially the fact that new unknown boards are connected to channels i and n of its switch. The system selects the first channel i on which there is a single board 20b, and reads its identifier 22. Identifier 22 indicates, for example, that there are more boards at a lower level.

Generally, when all the boards connected to one board of hierarchical level h have been scanned, the data processing system begins to scan the next board of level h, connected to a same board of higher level h-1. If there are no more boards of level h connected to the board of level h-1, the system begins to scan the next board of level h-1 connected to a same board of level h-2 . . . , and so on, until the data processing system finds the board to be tested. As the data processing system scans through the hierarchical levels, it may delete in its memory the paths which are unsuccessful, so that, when the board to be tested is found, only the single path necessary to reach that board remains.

To illustrate the process used to scan the system to test, one can consider the hierarchical graph formed by the interconnections between boards as a maze which is explored by constantly keeping one's right, in view of entirely running it through. In other words, the graph is scanned according to an Euler path which, in principle, allows to link together all the nodes formed by the master switches or boards. The (modified Roy) algorithm which allows to find this path is however changed so that it is possible to take a same path, i.e., a master switch channel, several times.

If the hierarchical graph does not include loops (which should normally be the case), it may be scanned entirely and reliably in the way explained above. In contrast, if the graph includes loops, special care should be taken to avoid the risk of going into an endless loop.

In practice, to store the path that is taken, the system stores a succession of numbers assigned to the boards that are encountered. For example, the successive numbers A-B-C-D-E-C-D-E have been stored for one path. The repetition of sequence C-D indicates that the system has entered a loop, and if it does not leave it, the sequence C-D-E is encountered continuously. The loop is detected by comparing each pair of two successive numbers (C-D) with the pairs of preceding numbers. If the pair is found again in the preceding pairs, the system is in a loop. In the above example, the identification of board C indicates, in reference to the data base, that board C is connected to boards having a lower level X, D and Y. Then, instead of going from board C to board D, the system chooses to go from board C to a board that has not been scanned yet, for example Y. Then, sequence C-D-Y is obtained instead of the second sequence C-D-E above.

A specific component of the board can be tested in two different ways. In a first case, the component to be tested is only known by its type (contained in the identifier of the component). Then, the data processing system successively scans the switch channels to which are connected sub-chains of components and reads the identifiers of the components. The channels connected to sub-chains of components, and the number of components of the sub-chains, are provided by information in the data base, associated with the board identifier 22. When the component to be tested is found, the system has also found the path for testing it, and the identifier of the component allows to find in the data base the test vectors and expected results to be used. In a second case, the location of a component to be tested in a sub-chain of the board is known, which allows to directly deduce its test path.

To test the connections of the board, the data base associates with each board identifier 22 a set of test vectors to be written in the boundary cells of the components, and a set of corresponding results to be read in the boundary cells.

These scan and test procedures of course apply to a simultaneous testing of several components or of several boards.

A testable system according to the invention may be entirely arbitrary and upgradeable. Indeed, any board will include a master switch having several channels adapted to be connected to other respective boards. A board need not be effectively connected to such a channel, because, by selecting an unused switch channel, the switch behaves like a chain with a single flip-flop containing "1", which indicates the absence of connection. In contrast, if a channel is designed to be connected to a chain of boards, each of the boards of the chain should be present to ensure the continuity of the chain.

Boards can be withdrawn or added to the system without needing an update of the data base, provided that the identifiers of a new board and of its components are recorded in the data base. If this is not the case, the data base just needs to be completed with the information on the new board, and not with the interconnections of the new board to the system.

The arbitrary organization, especially of the master switches 24, provides a significant flexibility of design for the board manufacturers, because the test signals, which are not necessary for the operation of a board, are always routed at the end. In high density boards, this final routing is very difficult, or impossible. The availability of switches with arbitrary channels highly facilitates this task.

The test vectors and the expected results are conventionally obtained by processing the CAD information used to fabricate the boards or the components.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

We claim:

1. A testable electronic system including testable elements having standardized test interfaces for organizing the elements in chains which behave like shift registers to ensure the exchange of test information, each element being either a component (10) including an identifier characterizing the behavior of the test of the component and accessible by the test interface of the component, or a switch (24) for organizing a chain in sub-chains which can be individually selected through channels of the switch, the system including master switches (24) which define respective sub-sets (20) of elements, a specific channel of each master switch being reserved to access an identifier (22) characterizing the test organization of the associated sub-set.

2. The system of claim 1, wherein the channels of each master switch (24), other than the reserved one, are connected to sub-chains that can include, in an arbitrary organization, one or more elements or master switches.

3. The system of claim 1, wherein each sub-set corresponds to a printed circuit board (20) including a connector (26) which connects its master switch (24) to a channel of a master switch of another board, all the boards being connected, through interposed master switches, to a channel of a master switch of a single interface board (28) through which the system is tested.

4. The system of claim 3, including a data base associating:

with each distinct component identifier (10), a set of test vectors and of corresponding expected results; and with each distinct sub-set or board identifier (22), information indicating the organization of the board's sub-chains, a set of test vectors associated with each sub-chain of the board, and the corresponding expected results.

5. A method of use of the testable electronic system of claim 4, including, to test a predetermined board, the step of scanning the graph formed by the connections between boards (20) until a path to the predetermined board is found, said graph being scanned by scanning each board that is found connected to a preceding board by using the information associated, in the data base, with the identifier (22) of the preceding board.

6. The method of claim 5, wherein the graph is scanned along an Euler path for linking all the boards (20) together, the algorithm for establishing the Euler path being modified so that the Euler path can pass more than once through a same channel.

7. The method of claim 5, including the step of testing the predetermined board by using vectors associated, in the data base, with the identifier (22) of the predetermined board, said vectors being provided, and the corresponding results being retrieved through the path that was found.

8. The method of claim 5, including the following steps:

searching for a predetermined component (10) by reading the identifiers of the components in the sub-chains of the predetermined board; and testing the predetermined component by using test vectors associated, in the data base, with the component's identifier.

* * * * *

(12) EX PARTE REEXAMINATION CERTIFICATE (9437th)
United States Patent
Deroux-Dauphin et al.

(10) Number: US 5,751,736 C1
(45) Certificate Issued: Dec. 14, 2012

(54) TESTABLE ELECTRONIC SYSTEM

(75) Inventors: Patrice Deroux-Dauphin, Saint Egreve (FR); Christian Francois, Civrieux (FR)

(73) Assignee: Roldan Block NY, LLC, Dover, DE (US)

Reexamination Request:
No. 90/011,533, Mar. 4, 2011

Reexamination Certificate for:
Patent No.: 5,751,736
Issued: May 12, 1998
Appl. No.: 08/694,595
Filed: Aug. 9, 1996

(30) Foreign Application Priority Data

Aug. 11, 1995 (FR) .................................... 95 09894

(51) Int. Cl.
*G01R 31/28* (2006.01)
*G01R 31/3185* (2006.01)
*G06F 11/00* (2006.01)

(52) U.S. Cl. ..................................................... 714/726

(58) Field of Classification Search .................... None
See application file for complete search history.

(56) References Cited

To view the complete listing of prior art documents cited during the proceeding for Reexamination Control Number 90/011,533, please refer to the USPTO's public Patent Application Information Retrieval (PAIR) system under the Display References tab.

*Primary Examiner* — Jeffrey Carlson

(57) ABSTRACT

A testable electronic system includes testable elements having standardized test interfaces for organizing the elements in chains which behave like shift registers to ensure the exchange of test information. Each element are either a component including an identifier characterizing the behavior of the test of the component and accessible by the test interface of the component, or a switch for organizing a chain in sub-chains which can be individually selected through channels of the switch. The system includes master switches which define respective sub-sets of elements, a specific channel of each master switch being reserved to access an identifier characterizing the test organization of the associated sub-set.

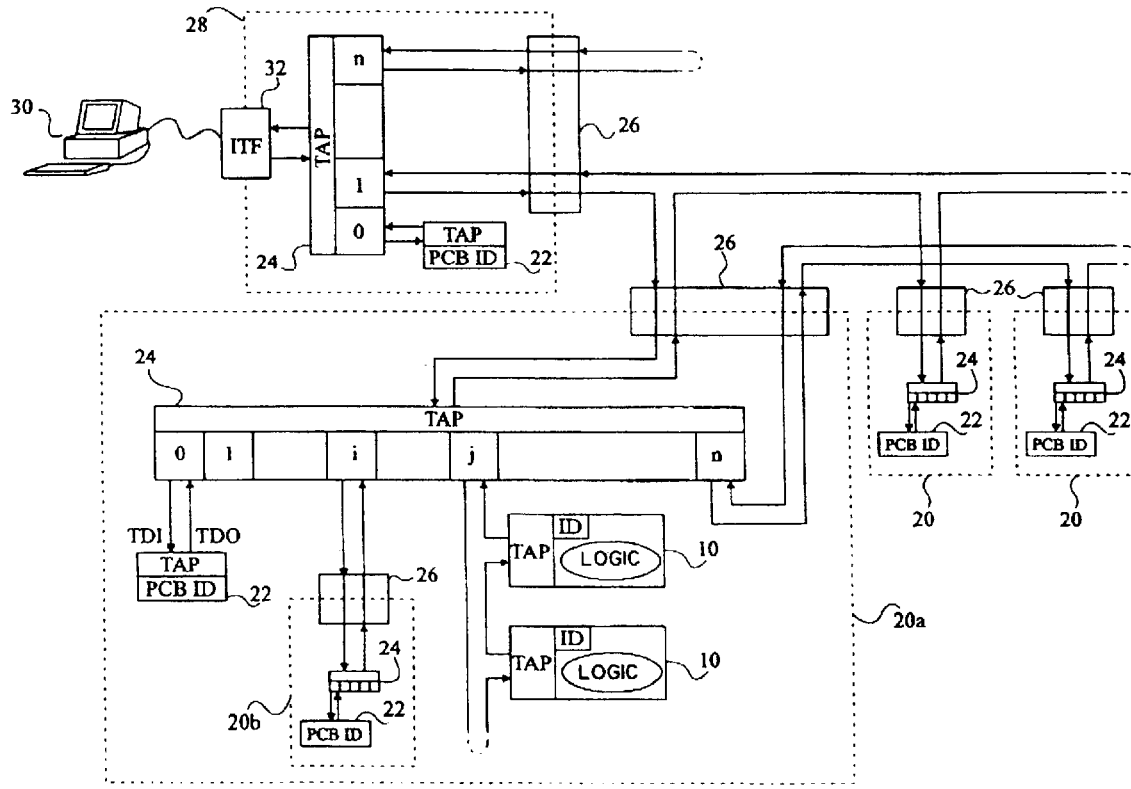

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-8 is confirmed.

New claims 9-24 are added and determined to be patentable.

*9. The system of claim 1, wherein respective ones of the channels of the switches are connected to one or more of the sub-chains comprising at least one of the elements or the switches.*

*10. The system of claim 1, further comprising a database.*

*11. The system of claim 10, wherein the database is configured to correlate respective ones of the identifiers of the components with sets of test vectors and corresponding expected results.*

*12. The system of claim 11, wherein the system is configured to:*
*search for a first one of the components by reading the identifiers of the components in the sub-chains; and*
*test the first one of the components by using the set of test vectors associated in the database with the identifier of the first one of the components.*

*13. The system of claim 10, wherein the database is configured to correlate the sub-sets or the identifiers (22) with information indicating the test organization of the sub-chains, a set of test vectors associated with each of the sub-chains, and corresponding expected results.*

*14. The system of claim 13, wherein the system is configured to test a first one of the sub-sets using the set of test vectors associated in the database with the identifier (22) of the first one of the sub-sets.*

*15. The system of claim 1, further comprising:*
*an interface board comprising an interface board switch;*
*wherein the sub-sets correspond to circuit boards, such that each of the circuit boards comprise:*
*a respective one of the switches;*
*a connector configured to couple the respective one of the switches from one of the circuit boards to a respective one of the switches of another one of the circuit boards; and*
*wherein each of the switches on each of the circuit boards is coupled to the interface board switch.*

*16. The system of claim 1, wherein:*
*the sub-sets correspond to circuit boards; and*
*the system is configured to generate a graph formed by connections between the circuit boards until a path to a chosen one of the circuit boards is found using the test organization of each of the circuit boards.*

*17. The system of claim 16, wherein the graph is based on an Euler path that is formed to link the circuit boards, such that the Euler path passes more than once through a same one of the channels.*

*18. A system comprising:*
*switches each having a plurality of channels; and*
*first identifiers characterizing a test organization of corresponding ones of one or more sub-sets of elements;*
*wherein a first channel of each of the plurality of channels is reserved to access a respective one of the first identifiers;*
*wherein each element in the one or more sub-sets of elements comprises:*
*a component associated with a corresponding second identifier that characterizes test behavior of the component, or*
*one of the switches being configured to organize the elements into at least one of a chain and sub-chains.*

*19. The system of claim 18, wherein the plurality of channels of the switches, other than the first channel, are connected to the sub-chains.*

*20. The system of claim 18, wherein the sub-sets are printed circuit boards that include respective connectors configured to connect the switches together.*

*21. The system of claim 18, further comprising:*
*a database configured to associate information indicating organization of the sub-chains, a set of test vectors associated with the sub-chains, and corresponding expected results with the first identifiers.*

*22. The system of claim 18, further comprising:*
*a database configured to associate a set of test vectors and corresponding expected results with the second identifiers.*

*23. The system of claim 18, further comprising:*
*a data processing system configured to determine a graph formed by connections between the sub-sets to determine a path to a predetermined one of the sub-sets, the graph based on using information associated with the first identifiers of the sub-sets.*

*24. The system of claim 23, wherein the data processing system is further configured to use a Euler path to determine the graph.*

* * * * *